United States Patent
Yabuta et al.

(10) Patent No.: US 8,389,996 B2
(45) Date of Patent: Mar. 5, 2013

(54) METHOD FOR FORMING SEMICONDUCTOR FILM, METHOD FOR FORMING SEMICONDUCTOR DEVICE AND SEMICONDUCTOR DEVICE

(75) Inventors: Hisato Yabuta, Machida (JP); Nobuyuki Kaji, Kawasaki (JP); Ryo Hayashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/254,429

(22) PCT Filed: Mar. 1, 2010

(86) PCT No.: PCT/JP2010/001383
§ 371 (c)(1),
(2), (4) Date: Sep. 1, 2011

(87) PCT Pub. No.: WO2010/100885
PCT Pub. Date: Sep. 10, 2010

(65) Prior Publication Data
US 2011/0309356 A1    Dec. 22, 2011

(30) Foreign Application Priority Data
Mar. 6, 2009    (JP) .................................. 2009-053712

(51) Int. Cl.
H01L 27/108    (2006.01)
H01L 29/00    (2006.01)
H01L 31/036    (2006.01)

(52) U.S. Cl. .................. 257/69; 257/449; 257/E21.632; 257/E29.296; 257/E31.126; 257/E33.064; 438/104; 438/197; 438/199; 438/482; 438/486; 438/608; 438/609

(58) Field of Classification Search .................... 257/69, 257/449, E21.632, E29.296, E31.126, E33.064; 438/104, 197, 199, 482, 486, 608, 609
See application file for complete search history.

(56) References Cited

U.S. PATENT DOCUMENTS

| | | |
|---|---|---|
| 3,442,647 A | 5/1969 | Klasens |
| 2003/0218221 A1 | 11/2003 | Wagner |
| 2007/0057261 A1 | 3/2007 | Jeong |

FOREIGN PATENT DOCUMENTS

| | | |
|---|---|---|
| JP | 2002-235177 A | 8/2002 |
| JP | 2007-57254 A | 3/2007 |
| WO | 2008/097117 A1 | 8/2008 |

OTHER PUBLICATIONS

Ogo et al., Appl. Phys. Lett., 93, 032113 (2008).
Massalski et al., "Binary Alloy Phase Diagrams", vol. 2, American Society for Metals, Metal Park, 1986.

*Primary Examiner* — Asok K Sarkar
(74) *Attorney, Agent, or Firm* — Canon U.S.A., Inc., IP Division

(57) ABSTRACT

A method for forming a SnO-containing semiconductor film includes a first step of forming a SnO-containing film; a second step of forming an insulator film composed of an oxide or a nitride on the SnO-containing film to provide a laminated film including the SnO-containing film and the insulator film; and a third step of subjecting the laminated film to a heat treatment.

15 Claims, 6 Drawing Sheets

METHOD FOR FORMING SEMICONDUCTOR FILM, METHOD FOR FORMING SEMICONDUCTOR DEVICE AND SEMICONDUCTOR DEVICE

TECHNICAL FIELD

The present invention relates to a method for forming a semiconductor device and such a semiconductor device.

BACKGROUND ART

To enhance the performance of thin-film transistors (TFTs) and to reduce the temperature used in and the cost of the processes for producing TFTs, various materials have been studied for use as materials for forming channel layers of TFTs. In particular, materials that are prominently used for forming such channel layers are amorphous silicon, polycrystalline silicon, microcrystalline silicon, organic semiconductors, and the like.

In recent years, oxide semiconductors represented by amorphous In—Ga—Zn—O oxide semiconductors have been attracting attention as novel and promising materials for forming such channel layers. Since such oxide semiconductors have excellent semiconductor characteristics and can be formed at low temperatures in a large area, application of the oxide semiconductors to TFTs for backplanes of organic EL displays and liquid crystal displays has been studied. Such oxide semiconductors are mostly n-type semiconductors and only a few p-type oxide semiconductors are known. Such a few p-type oxide semiconductors function as p-type semiconductors in pn junction devices, however, few p-type oxide semiconductors function as p-channel TFTs. Recently, it has been reported that an epitaxial SnO film has good p-type semiconductor characteristics and functions as a p-channel TFT in Non Patent Literature 1.

Since there are no oxide semiconductors usable as p-channel TFTs, application of oxide semiconductors to devices is restricted to TFTs for backplanes, which can be constituted by TFTs having either n-type conduction or p-type conduction, and there are few applications of oxide semiconductors to logic circuits and the like that require complementary operations.

At present, a SnO film is a rare material that has p-type semiconductor characteristics and functions as a TFT. However, when application of such a SnO film to semiconductor devices such as TFTs is attempted, it is difficult to provide devices having a large area with an epitaxial SnO film on a single crystal substrate and a considerable increase in production cost is also expected. SnO has a thermodynamic metastable phase and hence it is difficult to provide a single-phase SnO film. Accordingly, when a polycrystalline SnO film is formed, the resultant film has a metal Sn phase, a $SnO_2$ phase, or a mixed phase including a metal Sn phase and a $SnO_2$ phase, which results in poor performance as a p-type semiconductor. It is reported in Patent Literature 1 that a single-phase polycrystalline SnO film is obtained by thermal decomposition spraying in which a $SnF_2$ solution is used as a material. However, films obtained by this method generally have large surface irregularities and particles tend to be generated in the formation processes of such films. These disadvantages can cause problems such as degradation of performance of semiconductor devices or an increase in the level of defectiveness in the production processes of semiconductor devices.

Production of a complementary semiconductor device, which is a type of device including oxide semiconductors, requires individual formation of an n-type semiconductor film and a p-type semiconductor film. Accordingly, since the number of steps for forming films and accompanying steps is increased, an increase in production cost is expected.

CITATION LIST

Patent Literature

PTL 1: Japanese Patent Laid-Open No. 2002-235177

Non Patent Literature

NPL 1: Ogo et al., Appl. Phys. Lett., 93, 032113 (2008)

SUMMARY OF INVENTION

The present invention has been achieved as a result of thorough studies on how to overcome the above-described problems. The present invention provides a novel p-type oxide semiconductor film that can be employed as an active layer of a semiconductor device and a semiconductor device including such an oxide semiconductor. A method for forming a SnO-containing semiconductor film according to an embodiment of the present invention includes a first step of forming a SnO-containing film; a second step of forming an insulator film composed of an oxide or a nitride on the SnO-containing film to provide a laminated film including the SnO-containing film and the insulator film; and a third step of subjecting the laminated film to a heat treatment.

A method for forming a semiconductor device according to another embodiment of the present invention includes a first step of forming a SnO-containing film; a second step of forming an insulator film composed of an oxide or a nitride at least on a region of the SnO-containing film to provide a laminated film containing the SnO-containing film and the insulator film; and a third step of subjecting the laminated film to a heat treatment in an oxygen-containing atmosphere.

A semiconductor device according to another embodiment of the present invention includes an oxide semiconductor film having p-type conduction; and an oxide semiconductor film having n-type conduction, wherein the p-type oxide semiconductor film contains SnO and the n-type oxide semiconductor film contains $SnO_2$.

The term "SnO-containing film" refers to a film that contains SnO.

Advantageous Effects of Invention

According to the present invention, a single-phase polycrystalline SnO film can be provided.

Additionally, an n-type region and a p-type region can be formed as different regions without forming an n-type semiconductor film and a p-type semiconductor film in separate steps. In particular, by forming a SnO-containing film according to the present invention on the same surface, an n-type region and a p-type region can be formed as different regions on the same surface.

DESCRIPTION OF EMBODIMENTS

Figure 1:
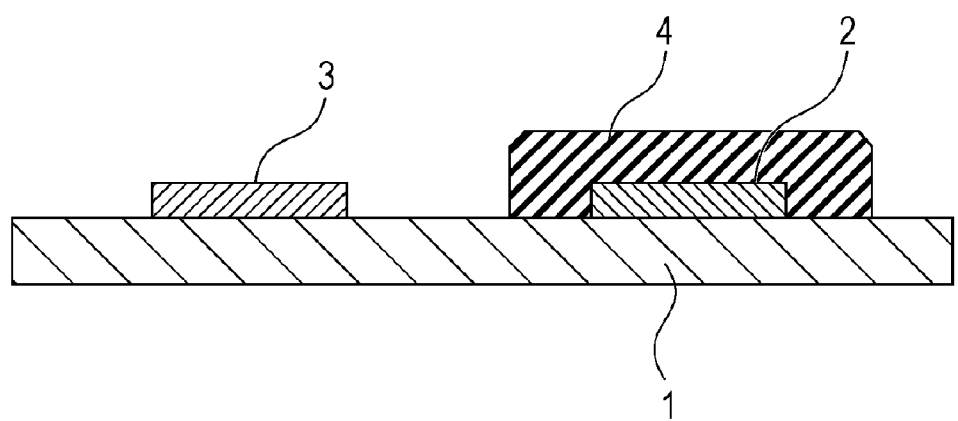
FIG. 1 is a schematic view of a configuration in which an n-type $SnO_2$ semiconductor region and a p-type SnO semiconductor region are formed on the same surface.

Hereinafter, embodiments according to the present invention will be described with reference to the drawings. However, the present invention is not restricted to these embodiments.

As described above, SnO has a metastable phase. For this reason, when a film obtained by sputtering with a SnO target is crystallized by a heat treatment, the resultant polycrystalline SnO film does not have a single phase but has a mixed phase including SnO, $SnO_2$, beta-Sn, or the like. However, a single-phase polycrystalline SnO film can be obtained by forming an insulator film directly on a SnO film and subjecting the resultant films to a heat treatment.

When a SnO film obtained by sputtering with a SnO target is subjected to a heat treatment, a region of the SnO film on which an insulator film is directly formed is turned into a p-type single-phase polycrystalline SnO film. In contrast, as a result of a heat treatment in an oxygen-containing atmosphere, a region of the SnO film that is exposed without being directly covered by a film on the region is turned into an n-type $SnO_2$ film. In this way, an n-type region and a p-type region can be formed as different regions on the same surface without forming an n-type semiconductor film and a p-type semiconductor film in separate steps.

A method for controlling formation of a SnO phase according to the present invention will be described. According to T. B. Massalsky (editor-in-chief), O—Sn (Oxygen-Tin) in Binary Alloy Phase Diagrams (American Society for Metals, Metal Park, 1986) Volume 2, p. 1789, there is no SnO phase in the equilibrium diagram of Sn and O. That is, it is difficult to obtain a SnO phase by heating Sn or $SnO_2$ serving as a starting material while oxygen rate is controlled. In general, a SnO phase is obtained by chemically synthesizing $SnF_2$ or $SnCl_2$, which is a halide of divalent tin, and oxidizing such a halide. The resultant SnO powder is then sintered to thereby provide a SnO target. When a SnO film is formed with such a SnO target by a physical film-formation method such as sputtering or pulsed-laser deposition, an amorphous film is formed at a low substrate temperature whereas a crystallized film is formed at a high substrate temperature. To control the crystalline phase of the SnO film in this film formation, control of the oxygen rate and substrate temperature is required. However, it is still difficult to obtain a single-phase SnO film under such control of the oxygen rate and substrate temperature. Thus, due to the instability of single-phase SnO film formation, the resultant film generally has a mixed phase including, in addition to a SnO phase, a beta-Sn phase, $SnO_2$ phase, or the like.

Ogo et al., Appl. Phys. Lett., 93, 032113 (2008) discloses that a single-phase SnO film is obtained by pulsed-laser deposition with a SnO target. Specifically, this is a method for forming a single-phase SnO epitaxial film in which the oxygen rate and substrate temperature are accurately controlled and a (111)-plane substrate composed of a yttria-stabilized zirconia single crystal, which has a lattice parameter closely matching the lattice parameter of a SnO crystal.

When a single-phase SnO film is formed on a substrate that does not have a lattice parameter closely matching the lattice parameter of a SnO crystal, the oxygen rate and substrate temperature should be more strictly controlled than in the epitaxial-film formation. However, such film formation under strict control of substrate temperature requires a margin of controllability for the purpose of enhancing yield and reproducibility. In contrast, an embodiment according to the present invention does not require strict control of substrate temperature during formation of a SnO-containing film. Specifically, an amorphous SnO film, which is a film containing SnO, is formed at room temperature while the oxygen rate is controlled (first step). An insulator film composed of a material such as $SiO_2$ is subsequently formed on the amorphous SnO film (second step). The resultant laminated film is then subjected to a heat treatment (third step). By controlling the temperature of the heat treatment in the third step, a single-phase SnO film can be provided. In this embodiment, in the first step, an amorphous SnO film, which is a film containing SnO, is formed while the oxygen rate is controlled, and, in the second step, an insulator film is formed on the amorphous SnO film. Because of the presence of the insulator film, the need for control of oxygen rate is eliminated in the third step and the effect of suppressing removal of oxygen from the amorphous SnO film and incorporation of oxygen into the amorphous SnO film is provided. As a result, a single-phase polycrystalline SnO film can be readily obtained.

According to another embodiment of the present invention, a film containing SnO is formed (first step) and an insulator film composed of an oxide or a nitride is subsequently formed at least on a region of the SnO-containing film (second step). The resultant laminated film is then subjected to a heat treatment in an oxygen-containing atmosphere (third step). In this way, by covering at least a region of the SnO-containing film with an insulator film, oxygen can be introduced (an oxidation reaction can be promoted) into only a target portion in the third step (heat treatment step in an oxygen-containing atmosphere). Additionally, films having different functions can be formed in the same heat treatment step. Specifically, a region (of the SnO-containing film) on which an insulator film has been formed in the second step is turned into a p-type semiconductor whereas a region (of the SnO-containing film) on which an insulator film has not been formed in the second step is turned into an n-type semiconductor. Thus, a pn junction or a p-type region and an n-type region can be formed. The p-type region and the n-type region may also be separated from each other (fourth step) before an insulator film is formed in the second step.

The p-type oxide semiconductor layer in the present invention is desirably polycrystalline (polycrystalline SnO). X-ray diffraction analysis of the p-type oxide semiconductor layer desirably provides diffraction lines (also referred to as diffraction peaks) due to polycrystalline SnO and desirably substantially does not provide diffraction lines due to tin oxides other than polycrystalline SnO. "Diffraction analysis substantially does not provide diffraction lines due to tin oxides other than polycrystalline SnO" in the present invention includes not only the case where no such diffraction lines are observed but also the case where such diffraction lines are observed at an intensity the same as the background level. In the present invention, instead of X-ray diffraction analysis (including fluorescence X-ray diffraction analysis), electron diffraction analysis or neutron diffraction analysis may also be used.

In the present invention, as a result of such diffraction analysis, at least one of diffraction lines corresponding to spacing of 2.99, 2.69, and 2.42 angstroms is desirably observed and substantially none of diffraction lines corresponding to spacing of 3.35, 2.64, 2.37, and 1.76 to 1.77 angstroms are desirably observed.

A p-type oxide semiconductor film according to the present invention can be used as a channel layer serving as an active layer in a semiconductor device such as a TFT.

A SnO-containing film according to the present invention is desirably formed by sputtering with a SnO ceramic serving as a target.

An insulator film according to the present invention desirably contains an oxide. In particular, the insulator film is desirably composed of $SiO_2$. An insulator film obtained by adding oxygen to an insulator film composed of a material such as SiN or SiC may also be used. Alternatively, an insulator film composed of another oxide such as $Al_2O_3$ or a nitride such as $SiN_x$ may also be used. However, depending on conditions of the heat treatment, there may be a case where such a non-oxide insulator film deprives an amorphous SnO film of oxygen and, as a result, the SnO film does not contain sufficiently large amount of oxygen. For this reason, an oxide-based insulator film is more desirably used.

A method for forming such an insulator film is not particularly restricted. However, sputtering is desirable because the oxygen content of the resultant film can be readily controlled.

The temperature of the heat treatment in the present invention is preferably in the range of 250 degrees C. or more and 600 degrees C. or less, more preferably, in the range of 300 degrees C. or more and 500 degrees C. or less.

EXAMPLES

Hereinafter, the present invention will be described in further detail with reference to examples. However, the present invention is not restricted to the following examples.

Example 1

An amorphous SnO film having a thickness of 20 to 30 nm was formed on a quartz substrate by RF sputtering with a SnO ceramic serving as a target. This film formation was conducted under conditions in which 20 W of RF power was applied, film formation atmosphere was Ar, and substrate temperature was set at room temperature. A $SiO_2$ film having a thickness of 200 nm and serving as an insulator film was formed by RF sputtering on the resultant SnO film. This film formation was conducted under conditions in which 400 W of RF power was applied, film formation atmosphere was Ar, and substrate temperature was set at room temperature.

Figure 2:
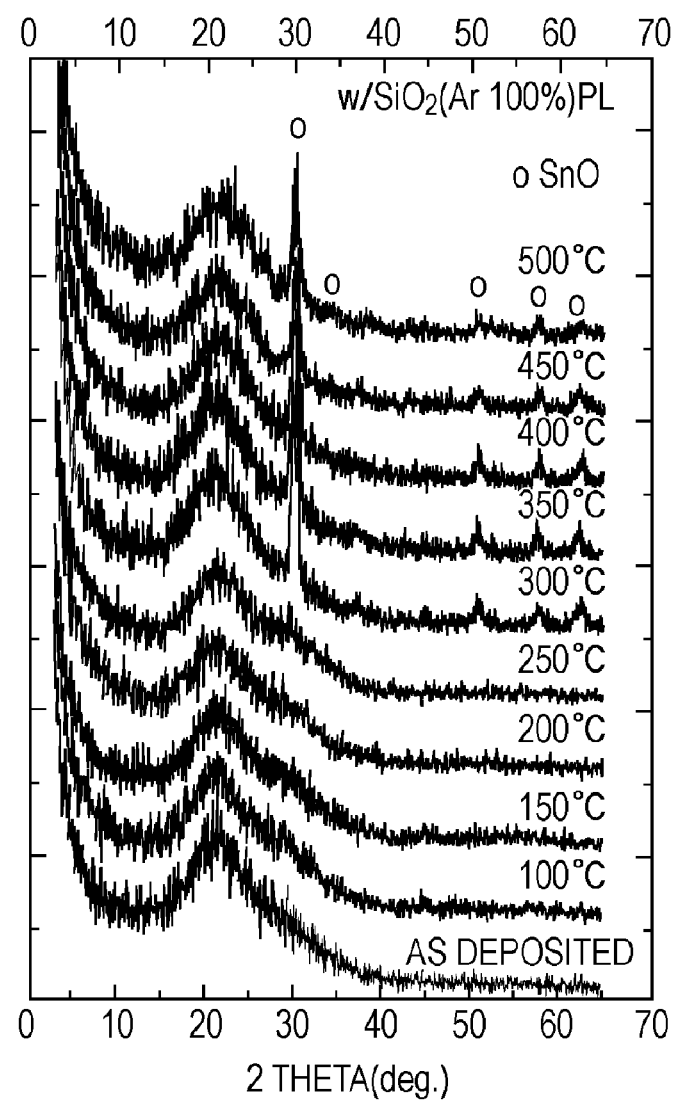
FIG. 2 shows diffraction patterns obtained by grazing incidence X-ray diffraction analysis of $SiO_2$/SnO laminated films having been subjected to heat treatments in oxygen.
Figure 3:
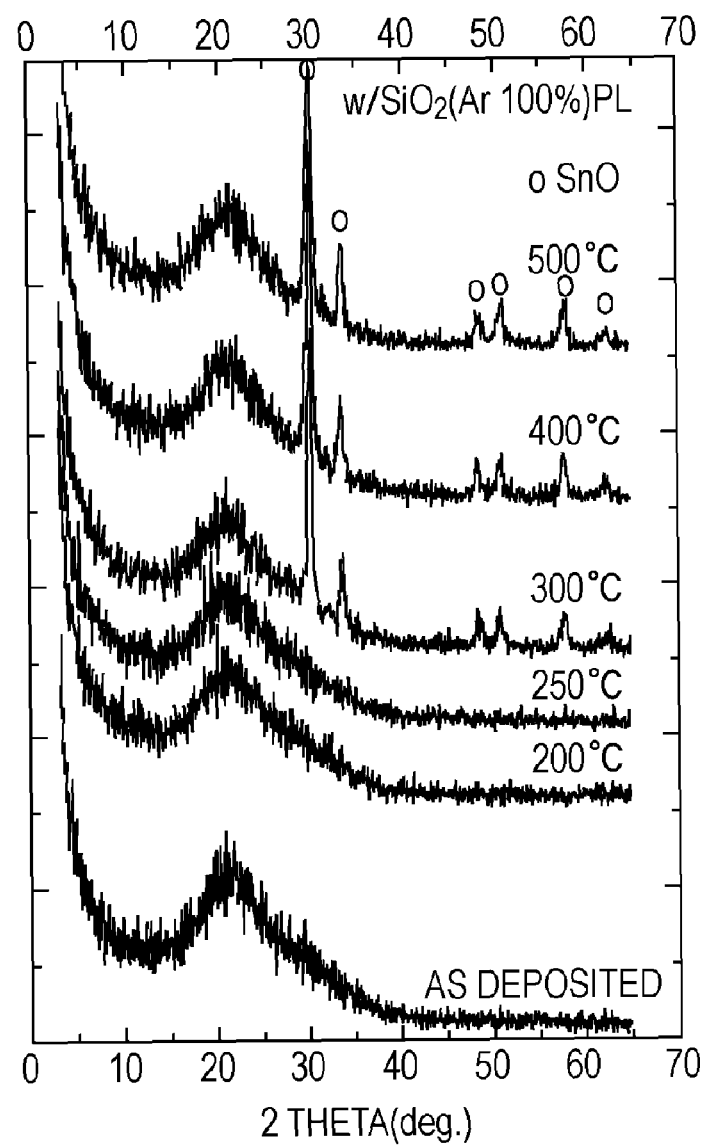
FIG. 3 shows diffraction patterns obtained by grazing incidence X-ray diffraction analysis of $SiO_2$/SnO laminated films having been subjected to heat treatments in nitrogen.

The resultant $SiO_2$/SnO laminated film sample was analyzed by a grazing incidence X-ray diffraction method. In the analysis, only the halo of the quartz substrate was observed, which showed that the SnO film was not crystallized. A plurality of such $SiO_2$/SnO laminated film samples were produced and some of these samples were subjected to heat treatments at different temperatures in an oxygen atmosphere with an electric furnace and the other samples were subjected to heat treatments in a nitrogen atmosphere at different temperatures. FIGS. 2 and 3 show the dependencies of the $SiO_2$/SnO laminated film samples, which were subjected to the heat treatments in oxygen and nitrogen, on the heat-treatment temperature, the dependencies being measured by grazing incidence X-ray diffraction analysis. Herein, FIG. 2 shows the results under measurement conditions of "SnO film (with $SiO_2$ insulator film) heat-treated in oxygen". FIG. 3 shows the results under measurement conditions of "SnO film (with $SiO_2$ insulator film) heat-treated in nitrogen".

Referring to FIGS. 2 and 3, only diffraction peaks due to polycrystalline SnO were observed in the heat-treatment temperature region of 300 degrees C. or more both in the heat treatments in the oxygen atmosphere and in the heat treatments in the nitrogen atmosphere. These results show that single-phase polycrystalline SnO films were obtained. A slight prominence of the diffraction line at a position corresponding to the SnO diffraction peak was observed also in the sample having been subjected to the heat treatment at 250 degrees C. This result shows that the crystallization started at about 250 degrees C. A sample was produced by forming an electrode on a SnO film, subsequently forming a $SiO_2$ film thereon, and subjecting the resultant laminated film to a heat treatment at 300 degrees C. in oxygen. A Hall effect measurement of this sample revealed that the SnO film had p-type conduction, a mobility of 0.1 to 1 $cm^2/Vs$, and a carrier density of $1 \times 10^{13}$ to $10^{19}/cm^{-3}$. Thus, the sample had better semiconductor characteristics than other p-type oxide semiconductors.

Comparative Example 1

Figure 4:
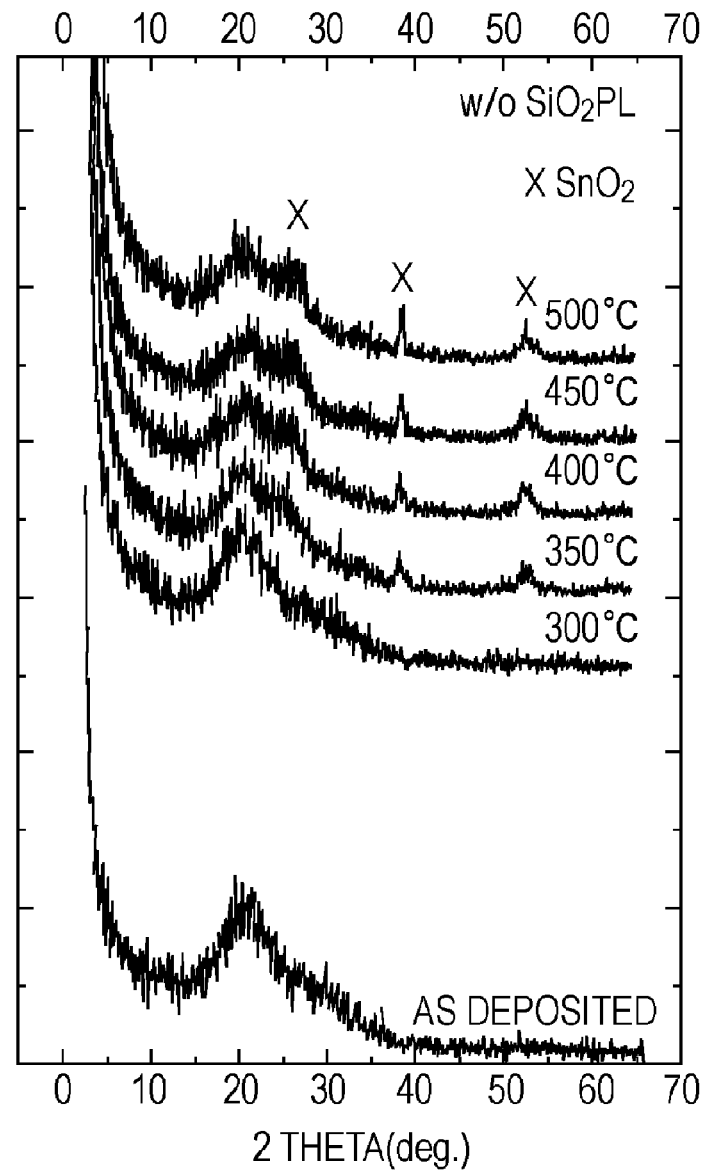
FIG. 4 shows diffraction patterns obtained by grazing incidence X-ray diffraction analysis of SnO films having been subjected to heat treatments in oxygen.
Figure 5:
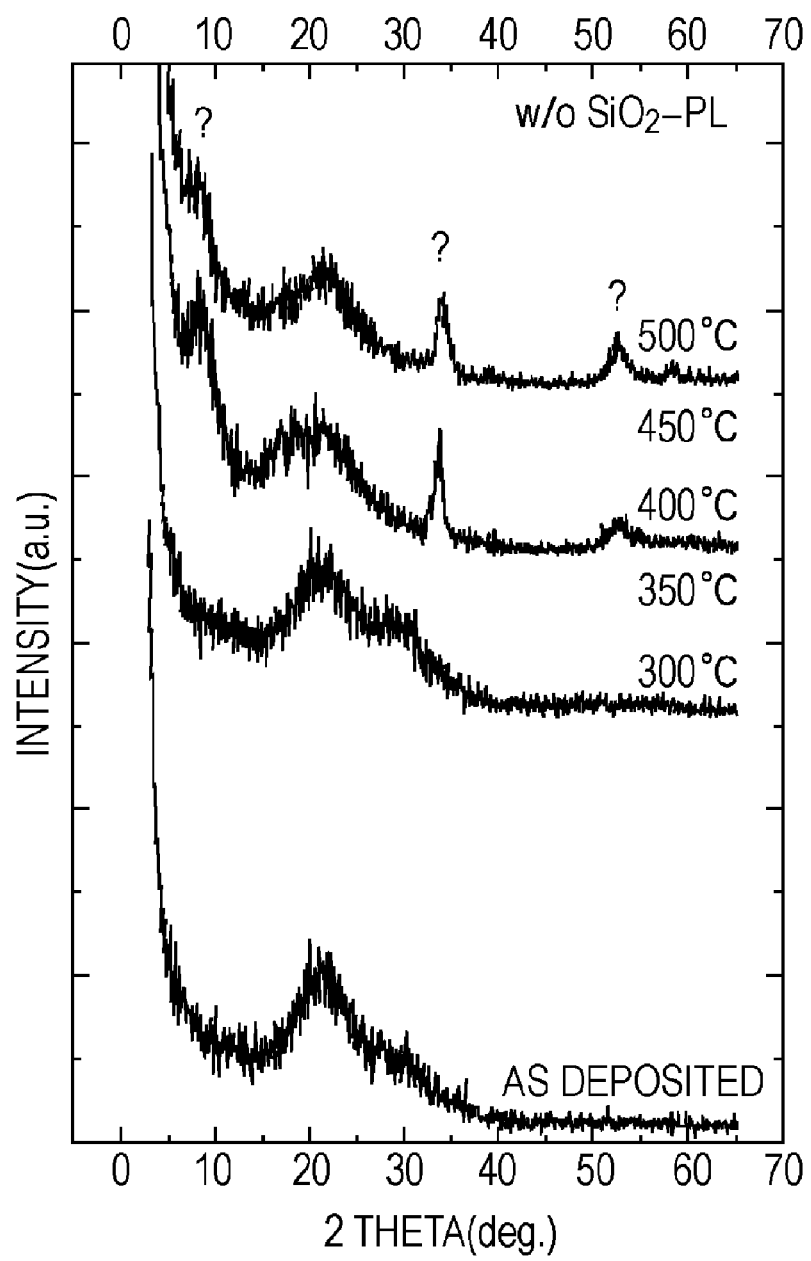
FIG. 5 shows diffraction patterns obtained by grazing incidence X-ray diffraction analysis of SnO films having been subjected to heat treatments in nitrogen.

Amorphous SnO films were formed under the same conditions as in EXAMPLE 1. No insulator films such as $SiO_2$ films were formed on the resultant SnO films. Some of the resultant samples in which the SnO films were exposed were subsequently subjected to heat treatments at different temperatures in an oxygen atmosphere. The other samples in which the SnO films were exposed were subjected to heat treatments at different temperatures in a nitrogen atmosphere. FIGS. 4 and 5 show dependencies of the SnO film samples, which were subjected to the heat treatments in oxygen and nitrogen, on the heat-treatment temperature, the dependencies being measured by grazing incidence X-ray diffraction analysis. Herein, FIG. 4 shows the results under measurement conditions of "SnO film (without $SiO_2$ insulator film) heat-treated in oxygen". FIG. 5 shows the results under measurement conditions of "SnO film (without $SiO_2$ insulator film) heat-treated in nitrogen".

Although the SnO films were crystallized at temperatures of 350 degrees C. or more by the heat treatments in the oxygen atmosphere, the resultant phase was polycrystalline $SnO_2$ phase. $SnO_2$ is a typical n-type semiconductor. A sample was produced by forming an electrode on a SnO film and subsequently subjecting the resultant film to a heat treatment at 300 degrees C. in oxygen. A Hall effect measurement of this sample revealed that the SnO film had n-type conduction.

Among the samples subjected to the heat treatments in nitrogen, the sample heat-treated at 300 degrees C. exhibited signs of crystallization and X-ray diffraction analysis of the samples heat-treated at 400 degrees C. or more provided evident diffraction peaks due to crystallization. However, these diffraction peaks are due to neither SnO, $SnO_2$, nor metal Sn. The crystalline phases of these samples were not identified.

Example 2

Figure 6:
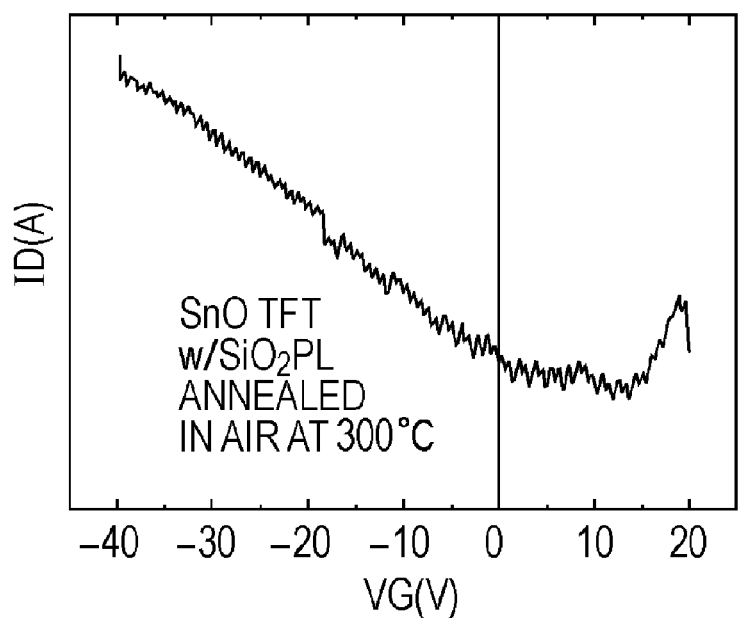
FIG. 6 shows a transfer characteristic of a SnO-channel TFT including a $SiO_2$ insulator film on the device.

Hereinafter, an example of production of a thin-film transistor (TFT) including a SnO film serving as a channel will be described. An amorphous SnO film was formed by sputtering on an n-type silicon substrate on which a thermally grown SiO₂ film having a thickness of 100 nm had been formed. The SnO film was formed under the same film-formation conditions as in EXAMPLE 1. The SnO film was etched so as to be patterned into regions having an appropriate size and serving as TFT channel regions. Source/drain electrodes were formed on the TFT channel regions by a liftoff process. A SiO₂ film having a thickness of 200 nm was formed on the source/drain electrodes by sputtering. A portion of the SiO₂ film on the source/drain electrodes was removed to form contact holes. The resultant substrate was then annealed at 300 degrees C. in the air. The thus-produced SnO-channel TFT was evaluated in terms of a transfer characteristic in which n-type silicon of the substrate was used as a gate electrode and the thermally grown SiO₂ film was used as a gate insulator film. As a result, referring to FIG. 6, the transfer characteristic of a p-type TFT in which current between source and drain increases with an increase of the gate voltage in the negative direction was obtained. Another TFT including a SnO film serving as a channel was produced as in the above-described manner except that a SiN film was formed on an n-type silicon substrate by plasma CVD. This TFT had a good transfer characteristic of a p-type TFT.

Example 3

Figure 7:
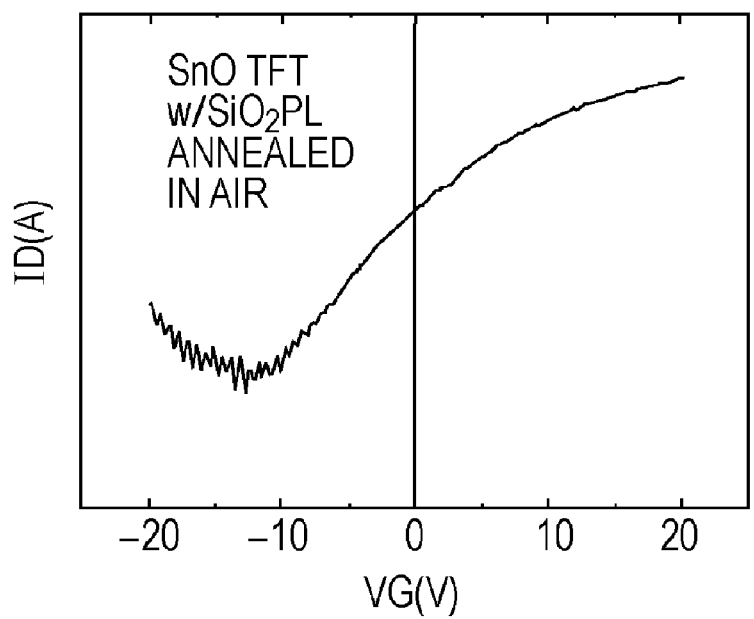
FIG. 7 shows a transfer characteristic of a SnO-channel TFT not including a $SiO_2$ insulator film on the device.

A TFT in which a SnO channel was exposed was produced in the same manner as in EXAMPLE 2 except that the step of forming the SiO₂ film after the formation of the source/drain electrodes was eliminated. This TFT was subjected to a heat treatment at 250 degrees C. in the air and subsequently evaluated in terms of a transfer characteristic. As a result, referring to FIG. 7, the transfer characteristic of an n-type TFT in which current between source and drain increases with an increase of the gate voltage in the positive direction. Such a mechanism can be used for readily forming an n-type semiconductor and a p-type semiconductor on the same surface. Specifically, referring to FIG. 1 serving as an example, an amorphous SnO film is formed on a substrate 1. A region 2 (to be turned into a p-type semiconductor) of the SnO film is then covered with an insulator film 4 whereas a region 3 (to be turned into an n-type semiconductor) of the SnO film is exposed without being covered with an insulator film. If necessary, as shown in FIG. 1, the n-type region 3 and the p-type region 2 may be separated from each other by removing a portion of the SnO film by etching or the like. The insulator film is desirably an oxide insulator film composed of SiO₂ or the like. Alternatively, the insulator film may be composed of SiN or the like. Another step of forming electrodes or the like may be conducted before the step of forming the insulator film. By subjecting the resultant substrate to a heat treatment in an oxygen-containing atmosphere, an n-type SnO₂ region and a p-type SnO region can be readily formed as different regions on the same surface.

A p-type TFT and an n-type TFT can be readily produced on the same surface with such n-type SnO₂ region and p-type SnO region that are formed as different regions in the above-described manner. A complementary semiconductor device can be formed with such a p-type TFT and an n-type TFT produced on the same surface. Such a complementary semiconductor device is, for example, a CMOS device including single crystal silicon.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-053712, filed Mar. 6, 2009, which is hereby incorporated by reference herein in its entirety.

The invention claimed is:

1. A method for forming a SnO-containing semiconductor film comprising:
a first step of forming an amorphous SnO-containing film;
a second step of forming a film comprising at least one of an oxide and a nitride on the amorphous SnO-containing film; and
a third step of crystallizing the amorphous SnO-containing film by performing a heat treatment to the amorphous SnO-containing film and the film.

2. The method according to claim 1, wherein the SnO-containing semiconductor film contains polycrystalline SnO.

3. The method according to claim 2, wherein X-ray, electron, or neutron diffraction analysis of the SnO-containing semiconductor film provides diffraction lines due to polycrystalline SnO and substantially does not provide diffraction lines due to tin oxides other than polycrystalline SnO.

4. A method for forming thin-film transistor having a source electrode, a drain electrode, a gate electrode and a SnO-containing semiconductor film, wherein the SnO-containing semiconductor film is formed in the method according to claim 1.

5. The method according to claim 1, wherein the temperature of the heat treatment in the third step is in the range of 250 degrees C. or more and 600 degrees C. or less.

6. The method according to claim 1, wherein the temperature of the heat treatment in the third step is in the range of 300 degrees C. or more and 500 degrees C. or less.

7. A method for forming a semiconductor device comprising:
a first step of forming an amorphous SnO-containing film;
a second step of forming a film comprising at least one of an oxide and a nitride, by covering and not covering a part of the amorphous SnO-containing film; and
a third step of crystallizing the amorphous SnO-containing film of the region where covered with the film in the second step by performing a heat treatment in an oxygen-containing atmosphere to the amorphous SnO-containing film and the film.

8. The method according to claim 7, wherein, the amorphous SnO-containing film of the region where covered with the film in the second step is formed to a film containing polycrystalline SnO in the third step.

9. The method according to claim 8, wherein, the amorphous SnO-containing film of the region where not covered with the film in the second step is formed to a film containing SnO₂ in the third step.

10. The method according to claim 7, further comprising:
a fourth step of separating, before the second step, the amorphous SnO-containing film into a region to be turned into a p-type semiconductor and a region to be turned into an n-type semiconductor.

11. A semiconductor device comprising:
a substrate;
an oxide semiconductor film having p-type conduction; and
an oxide semiconductor film having n-type conduction,
wherein the p-type oxide semiconductor film contains SnO and the n-type oxide semiconductor film contains SnO₂, and
where the p-type oxide semiconductor film and the n-type oxide semiconductor film are formed as different regions on the same surface of the substrate.

12. The semiconductor device according to claim 11, wherein the p-type SnO-containing film contains polycrystalline SnO.

13. The semiconductor device according to claim 11, wherein X-ray, electron, or neutron diffraction analysis of the SnO-containing film provides diffraction lines due to polycrystalline SnO and substantially does not provide diffraction lines due to tin oxides other than polycrystalline SnO.

14. The semiconductor device according to claim 11, wherein the semiconductor device is a thin-film transistor including the SnO-containing film serving as a channel.

15. The semiconductor device according to claim 11, wherein the semiconductor device is a complementary semiconductor device.

* * * * *